United States Patent
Hu et al.

(10) Patent No.: US 7,217,756 B2
(45) Date of Patent: May 15, 2007

(54) HIGH PERFORMANCE WATER-BASED PRIMER

(75) Inventors: Geoffrey Yuxin Hu, San Diego, CA (US); Elizabeth Olsen, Vista, CA (US); David H. Roberts, Carlsbad, CA (US)

(73) Assignee: Napp Systems, Inc., San Marcos, CA (US)

( * ) Notice: Subject to any disclaimer, the term of this patent is extended or adjusted under 35 U.S.C. 154(b) by 271 days.

(21) Appl. No.: 10/805,769

(22) Filed: Mar. 22, 2004

(65) Prior Publication Data

US 2005/0209369 A1    Sep. 22, 2005

(51) Int. Cl.
*C08K 3/34*    (2006.01)
(52) U.S. Cl. .................. 524/445; 524/440; 524/441; 524/501; 524/589; 524/591
(58) Field of Classification Search ............... 524/445, 524/440, 441, 501, 589, 591
See application file for complete search history.

(56) References Cited

U.S. PATENT DOCUMENTS

| | | | |
|---|---|---|---|
| 2,760,863 | A | 8/1956 | Plambeck, Jr. |
| 3,036,913 | A | 5/1962 | Metuchen |
| 5,175,076 | A | 12/1992 | Ishikawa et al. |
| 5,187,044 | A | 2/1993 | Prioleau et al. |
| 6,106,950 | A | 8/2000 | Searle et al. |
| 6,410,635 | B1 | 6/2002 | Kaylo et al. |
| 6,451,896 | B1 * | 9/2002 | Wandelmaier et al. ...... 524/445 |
| 6,551,759 | B2 | 4/2003 | Daems et al. |

* cited by examiner

*Primary Examiner*—Robert D. Harlan
(74) *Attorney, Agent, or Firm*—Carmody & Torrance LLP

(57) ABSTRACT

The present invention relates to an aqueous primer composition for use in manufacturing flexographic printing plates. The aqueous primer composition comprises a polyurethane, a copolymer, a layered silicate, and optionally a surfactant and/or a dye or pigment. The use of the layered silicate as a filler in the primer composition produces an improved primer composition with a stronger water/solvent resistance and less delamination.

18 Claims, No Drawings

HIGH PERFORMANCE WATER-BASED PRIMER

FIELD OF THE INVENTION

The invention is directed to an aqueous primer composition for improving the adhesion between a photosensitive resin and the underlying substrate in the production of relief image printing elements.

BACKGROUND OF THE INVENTION

Flexographic printing is widely used in the production of newspapers and in the decorative printing of packaging media. Photosensitive printing plates have been developed to meet the demand for fast, inexpensive processing and long press runs.

The photocurable element generally comprises a substrate, one or more photocurable layers, and a protective cover sheet. The protective cover sheet is formed from plastic or any other removable material that can protect the plate or photocurable element from damage until it is ready for use. The photocurable element can optionally comprise a slip film disposed between the protective cover sheet and the photocurable layer(s) to protect the plate from contamination, increase ease of handling, and act as an ink-accepting layer.

The photosensitive resin composition is deposited onto the substrate to form a printing element. The photosensitive resin composition may be deposited onto the substrate in a variety of ways, e.g., by extrusion, roll coating, heat processing, solvent casting, and the like. These techniques can be readily carried out by those skilled in the art.

The desired image is produced on the printing plate by exposing selected portions of the photosensitive resin to actinic radiation. Selective exposure of the photosensitive resin can be achieved for example, by the use of an image-bearing transparency such as a negative film on the surface of the photosensitive layer, through the front side of the photosensitive resin. Areas of the transparency opaque to actinic radiation prevent the initiation of free-radical polymerization within the photosensitive layer directly beneath the transparency. Transparent areas of the image-bearing element allow the penetration of actinic radiation into the photosensitive layer, initiating free-radical polymerization, rendering those areas insoluble in the processing solvent. Alternatively, exposure of selected portions of the photosensitive layer to laser radiation may also initiate free-radical polymerization, rendering those areas insoluble in the processing solvent.

The unexposed and therefore unhardened portions of the resin are selectively removed by washing in a suitable solvent. Washing may be accomplished by a variety of processes, including brushing, spraying, or immersion. The resulting surface has a relief pattern that reproduces the image to be printed. The printing element is mounted on a press and printing commences.

The support sheet, or backing layer, can be formed from a suitable transparent or opaque material such as paper, cellulose film, plastic, or metal. Preferred substrate materials include steel, copper or aluminum sheets, plates, or foils, paper, or films or sheets made from synthetic polymeric materials such as polyesters, polystyrene, polyolefins, polyamides, and the like.

The photosensitive layer(s) can include a variety of known photosensitive materials, such as photopolymers, initiators, reactive diluents, fillers, and dyes. Preferred photosensitive compositions include an elastomer compound, an ethylenically unsaturated compound having at least one terminal ethylenic group, and a photoinitiator. Such materials are described in numerous patents and publications and are well known to those skilled in the art Normally, these photopolymer resins have very poor adhesive properties to the underlying metal or polymer substrates. Therefore, the support sheet can optionally comprise an adhesive layer, i.e., a primer or anchor layer, for more secure attachment to the photocurable layer(s). However, the solvent-like components in the photopolymer resin constantly attack the primer layer before and after curing, resulting in the delamination of the cured relief photopolymer from the underlying substrate.

Water-based polyurethane coatings with various kinds of inorganic fillers have been suggested for use as the primer layer in flexographic printing plates. These fillers include small particles of titanium oxide, zinc oxide, calcium carbonate, silicon gels (zeospheres and zeolites), and polymer materials, such as small particles of polyamides, polystyrene, and other similar materials.

While the water-based polyurethanes generally have very good resistance to water and/or organic solvents after the coatings are cured, when these coatings are used as primer layers for flexographic printing plates, the water/solvent resistance properties are weakened by the continuous intersurface contact either on top or at the bottom of the primer layer.

U.S. Pat. No. 2,760,863 to Plambeck, the subject matter of which is herein incorporated by reference in its entirety, teaches that when the support material is not sufficiently adherent to the photopolymerized layer, a separate anchor layer may be used. The anchor layer is made of a compatible resin or film-forming polymer which is strongly adherent to both the support and the photopolymerized layer. Plambeck discloses that in some cases, two or more different anchor layers can be used so that the photopolymerized layer is strongly adherent to the coated support.

U.S. Pat. No. 6,551,759 to Daems et al., the subject matter of which is herein incorporated by reference in its entirety, describes an optional primer layer provided between the support layer and the photopolymerizable layer. The primer layer preferably comprises aziridine functional compounds which may be diluted with solids that comprise inert compatible polymeric organic binders, coupling agents, particulate, comonomers, other priming agents, and the like. U.S. Pat. No. 5,187,044 to Prioleau et al., the subject matter of which is herein incorporated by reference in its entirety, also describes a primer layer that comprises an aziridine functional material that may be diluted with solids that comprise inert compatible polymeric organic binders, coupling agents, particulate, comonomers, other priming agents, and the like. Prioleau et al. suggests that the primer compositions are suited for use in flexographic printing plates when used in conjunction with a support layer or sheet to which they are adhered.

U.S. Pat. No. 6,410,635 to Kaylo et al., the subject matter of which is herein incorporated by reference in its entirety, describes compositions comprising an exfoliated silicate material (i.e., a montmorillonite clay) to enhance properties such as appearance, crater resistance, and rheology control. Kaylo et al. suggest that the compositions are particularly useful as color and/or clear coatings in color-clear composite coatings. However, Kaylo et al. do not suggest that the compositions are usable as the primer or anchor layer for a flexographic printing plate.

U.S. Pat. No. 3,036,913 to Burg and U.S. Pat. No. 5,175,076 to Ishikawa et al., the subject matter of each of which is herein incorporated by reference in its entirety also describe primer compositions for increasing the adhesion of photopolymerizable layers to an underlying substrate in processes for making printing plates.

While many primer compositions have been developed, there remains a need in the art for further improvements to the primer layers used for adhering photopolymer resins to an underlying substrate in the manufacture of flexographic printing plates.

The inventors have surprisingly discovered that the addition of a layered silicate material as a filler, more preferably a montmorillonite clay, into a water-based polyurethane primer composition, produces an improved primer composition with a stronger water/solvent resistance and less delamination as compared to polyurethane primers of the prior art.

SUMMARY OF THE INVENTION

The present invention is directed to an aqueous polyurethane primer composition for use in manufacturing flexographic printing plates. The aqueous primer composition of the invention typically comprises:
 a) a binder, preferably a polyurethane;
 b) preferably, a copolymer or monomer;
 c) a layered silicate;
 d) optionally, a surfactant; and
 e) optionally, a dye or pigment.

The invention also describes a method of making the primer composition and a method of using the primer composition in the manufacture of flexographic printing elements.

DETAILED DESCRIPTION OF THE PREFERRED EMBODIMENTS OF THE INVENTION

The inventors have surprisingly discovered that the addition of a layered silicate as a filler into a water-based urethane primer composition produces a primer with a stronger water/solvent resistance. The improved primer composition of the invention enhances the adhesive properties at the interface of the primer/substrate and interface of the primer/photopolymer resin before and after curing and improves the adhesion of the photosensitive resin to the underlying substrate.

The improved primer composition of the instant invention preferably comprises an aqueous dispersion of polyurethane and a copolymer with a layered silicate material as a filler. Binders other than polyurethanes, such as polyesters, polycyclic, styrene-butadiene polymers can be substituted for the polyurethane. Preferably the binder used is capable of being dispersed in an aqueous solution, emulsion, dispersion or developer. The copolymer can be any monomer or ogligomer that is capable of crosslinking with the binder. Optionally and preferably, the composition further comprises a non-ionic surfactant and/or a dye or pigment.

The primer composition of the invention is an aqueous dispersion comprising:
 1) a binder, which is preferably a polyurethane;
 2) preferably, a monomer or copolymer;
 3) a layered silicate;
 4) optionally, a surfactant;
 5) optionally, a dye or pigment.

The polyurethane binder typically comprises aliphatic and/or aromatic urethanes and is present in the aqueous dispersion at a concentration of about 20% to about 75%, preferably about 45% to about 60% by weight based on non-volatile content. One suitable polyurethane that is usable in the dispersion of the invention is NeoRez® R-966 polyurethane dispersion, available from NeoRez. Other useful binders include evaterborne, polyesters, polyacrylics, styrene-butadiene emulsions, and other similar water dispersible polymers or copolymers.

The monomer/copolymer typically comprises an acrylic acid copolymer such as an ethylene acrylic acid copolymer. Other suitable copolymers/monomers include copoly (styrene butadiene). The copolymer is typically present in the aqueous dispersion at a concentration of about 5% to about 75%, more preferably about 20% to about 50% by weight based on non-volatile content. One suitable copolymer that is usable in the dispersion of the invention is Michem® 4983-40R, available from the Michelman.

The layered silicates are used in the dispersion at a concentration of about 1% to about 10% by weight based on non-volatile (i.e. dry) content and are preferably dispersed in deionized water before being added to the primer composition. The layered silicate dispersion is typically mixed into the aqueous primer composition through high shear mixing.

Layered silicate materials suitable for use in the primer coating compositions of the invention include but are not limited to, phyllosilicates, such as smectite clay minerals, for example montmorillonite, particularly sodium montmorillonite, calcium montmorillonite and/or magnesium montmorillonite, nontronite, biedellite, volkonskoite, hectorite, saponite, sauconite, sobockite, stevensite, svinfordite, vermiculite and the like. Other useful layered materials include micaceous minerals such as illite and mixed layered illite/smectite minerals.

Preferred layered silicate materials are phyllosilicates. More preferably, the layered silicate materials are smectite clay minerals such as montmorillonite, nontronite, biedellite, volkonskoite, hectorite, saponite, sauconite, sobockite, stevensite, and svinfordite. The most preferred of these being montmorillonite materials.

The layered silicates are dispersed into the aqueous polyurethane dispersion through high shear mixing.

The surfactant is typically a non-ionic surfactant. Preferably, a pre-mixture of the surfactant, a rheology modifier, and water is prepared and the pre-mixed surfactant is added to the polyurethane dispersion of the invention. Suitable non-ionic surfactants include alkoxylated silicones, and ethoxylated nonylphenol or octylphenol. Typically the surfactant is present in the aqueous dispersion at a concentration of about 0.5% to about 5%, preferably about 1% to about 2% by weight based on non volatile content. One suitable surfactant that is usable in the dispersion of the invention is a polydimethylsiloxane methylethoxylate non-ionic surfactant (Silwet® L-7600, available from Osi).

A dye or pigment can also be added to the aqueous dispersion of the invention. Suitable dyes and/or pigments include iron oxide, aluminum flake pthalocyanine green and carbon black. Typically, the dye or pigment is present in the aqueous dispersion at a concentration of about 0.5% to about 24%, preferably about 3% to about 10% by weight based on non-volatile content.

Afterwards, the mixture is applied to the substrate through roll coating, brush coating, or spraying. The coated surface with the mixture has stronger water/solvent resistance than a polyurethane aqueous dispersion that is applied without the filler or with fillers that are conventionally used, i.e., titanium oxide, zinc oxide, calcium carbonate, etc., discussed above. The inventors have found that the improved primer of the invention produces a layer that has stronger adhesive properties and less delamination as compared to primer formulations of the prior art. In one embodiment, the underlying substrate may be "pre-treated" with an adhesion promoting composition prior to applying the primer to the substrate.

The invention will now be described with reference to the following non-limiting examples.

COMPARATIVE EXAMPLE 1

A pre-treatment solution was prepared by mixing 5 parts of an aqueous diamino/alkyl-functional siloxane co-oligomer as an adhesion promoter (Hydrosil 2776, available from Degussa) with 95 parts water.

A surfactant pre-mix was prepared by adding 0.4 parts of a polydimethylsiloxane methylethoxylate non-ionic surfactant (Silwet® L-7600, available from OSi) and 1.8 parts of a rheology modifier (DSX 1510, available from Cognis) to 97.8 parts deionized water.

The primer was prepared using a low shear mixer. The following were mixed in the order given:

| | |
|---|---|
| 55 parts | NeoRez® R-966 polyurethane dispersion (available from NeoRez) |
| 40 parts | Surfactant pre-mix |
| 5 parts | Pigment (green 7 dispersion Lioconc Green B-1, available from Toyo Ink) |

The primer was mixed at room temperature for an additional 15 minutes.

A length of 0.0066-inch thick tin-free steel was cleaned by sequentially washing with 0.2 N aqueous sodium hydroxide, rinsing with soft (i.e., deionized) water then drying with hot air. The pre-treatment solution was applied via roll coating to the cleaned steel and dried. The primer composition was coated over the pre-treatment layer via a roll coater to a wet thickness of 30-45 microns. The sheet was then dried at 400° F. for 75 seconds.

A photosensitive resin (HS-2, available from NAPP Systems) was passed through a single screw extruder and sheet die at approximately 80° C. to apply a 15 mil thick layer onto a length of the pre-coated tin-free steel substrate.

COMPARATIVE EXAMPLE 2

A primer was prepared and coated onto a pre-treated substrate as described in Comparative Example 1.

A photosensitive resin (CBX, available from MacDermid Printing Solutions) was passed through a single screw extruder and sheet die at approximately 80° C. to apply a 15 mil thick layer of the CBX resin onto a length of the pre-coated substrate.

EXAMPLE 3

A layered silicate (nanoclay) dispersion was prepared by adding 10 parts Nanomer® PGV (available from Nanocor) to 90 parts deionized water and mixing the dispersion with a high shear mixer until fully dispersed, approximately _____ minutes.

A surfactant pre-mix was prepared by adding 10 parts of a polydimethylsiloxane methylethoxylate non-ionic surfactant (Silwet® L-7600, available from Osi) and 10 parts of a rheology modifier (DSX 1510, available from Cognis) to 80 parts deionized water.

Using a low shear propeller mixer, the following were mixed in the order given:

| | |
|---|---|
| 50 parts | NeoRez ® R-966 polyurethane dispersion (available from NeoRez) |
| 15.5 parts | Michem ® Prime 4983-40R ethylene acrylic acid copolymer dispersion (available from Michelman) |
| 20 parts | Nanoclay dispersion |
| 7 parts | Surfactant pre-mix |
| 4 parts | Pigment (green 7 dispersion Lioconc Green B-1, available from Toyo Ink) |

The primer was mixed at room temperature for an additional 15 minutes.

As in Comparative Example 1, a length of 0.0066-inch thick tin-free steel was cleaned by sequentially washing with 0.2 N aqueous sodium hydroxide, rinsing with soft (i.e., deionized) water then drying with hot air. The pre-treatment solution described in Comparative Example 1 was applied via roll coating to the cleaned steel and dried. The primer composition was then coated over the pre-treatment layer via a roll coater to a wet thickness of 25-45 microns. The sheet was then dried at 400° F. for 75 seconds.

A photosensitive resin (HS-2, available from NAPP Systems) was passed through a single screw extruder and sheet die at approximately 80° C. to apply a 15 mil thick layer onto a length of the pre-coated tin-free steel substrate.

EXAMPLE 4

The layered silicate dispersion was prepared as described in Example 3.

A surfactant pre-mix was prepared by adding 10 parts polydimethylsiloxane methylethoxylate non-ionic surfactant (Silwet® L-7600, available from Osi) and 10 parts of a rheology modifier (DSX 1510, available from Cognis), 40 parts pf a polypropylene glycol (Carpol PGP 400, available from Carpenter) to 40 parts deionized water.

Using a low shear propeller mixer, the following were mixed in the order given:

| | |
|---|---|
| 45 parts | NeoRez R-966 polyurethane dispersion (available from NeoRez) |
| 20 parts | Michem Prime 4983-40R ethylene acrylic acid copolymer dispersion (available from Michelman) |
| 10 parts | Deionized water |
| 20 parts | Nanoclay dispersion |
| 5 parts | Ssurfactant pre-mix |

The primer was mixed at room temperature for an additional 15 minutes.

A length of 0.0066-inch thick tin-free steel was cleaned by sequentially washing with 0.2 N aqueous sodium hydroxide, rinsing with soft (i.e., deionized) water then drying with hot air. The pre-treatment solution was applied via roll coating to the cleaned steel and dried. The primer composition was coated over the pre-treatment layer via a roll coater to a wet thickness of 30-45 microns. The sheet was then dried at 400° F. for 75 seconds.

A photosensitive resin (HS-2, available from NAPP Systems) was passed through a single screw extruder and sheet die at approximately 80° C. to apply a 15 mil thick layer onto a length of the pre-coated tin-free steel substrate.

EXAMPLE 5

The layered silicate dispersion was prepared as described in Example 3.

Using a low shear propeller mixer, the following were mixed in the order given:

| | |
|---|---|
| 50 parts | NeoRez ® R-966 polyurethane dispersion (available from NeoRez) |
| 15 parts | Dow Latex 233 NA (available from Dow) |
| 5 parts | Trixene BI 7986 (available from Baxenden) |
| 6 parts | Deionized water |
| 20 parts | Nanoclay dispersion |
| 4 parts | High Solids Pigment Green 7 Dispersion (Available from CDR Pigments and Dispersions). |

The primer was mixed at room temperature for an additional 15 minutes.

A length of 0.0066-inch thick tin-free steel was cleaned by sequentially washing with 0.2 N aqueous sodium hydroxide, rinsing with soft (i.e., deionized) water then drying with hot air. The pre-treatment solution was applied via roll coating to the cleaned steel and dried. The primer composition was coated over the pre-treatment layer via a roll coater to a wet thickness of 30-45 microns. The sheet was then dried at 400° F. for 75 seconds.

A photosensitive resin (CBX, available from MacDermid Printing Solutions) was passed through a single screw extruder and sheet die at approximately 80° C. to apply a 15 mil thick layer of the resin onto a length of the pre-coated substrate.

Once the printing plates described in the examples were formed, two measures of adhesion were used to determine adhesion of the photopolymer resin to the underlying substrate, a peel test and a scratch test.

The plates in Comparative Example 1, Example 3, and Example 4 were processed to produce a plate having solid image areas that could be tested for adhesion. The image was cut through the resin and primer with a razor blade and the photopolymer layer peeled up starting at the cut edge. If peeling occurred, it was noted whether peeling was at the metal/primer interface, the primer/resin interface, or cohesive failure of the primer. The peel test was done immediately after processing, then after soaking in soft water for 1 hour, 5 hours, 1 day and three days. The test was stopped when adhesion failed. The results of the peel test are set out in Table 1. testing. To simplify this search, certain observable discontinuities (or events) in the tests are recorded from the plot of distance vs. three parameters. These events include:

1) Abrupt increase in the recorded noise generated by the diamond;
2) Abrupt increase in the diamond drag force; and
3) Abrupt increase in the effective friction.

After noting the measured location on the track, the operator uses these locations as a guide to determine the most likely coating failure site, or the critical event. Once having found the critical event, the related critical force is found from the plot and is a measure of the coating's adherence.

TABLE 1

Peel Test and Scratch Test Results

| | Peel Test | Stylometer Scratch Test |
|---|---|---|
| COMPARATIVE EXAMPLE 1 | Peels easily after soaking 5 hours Primer/metal failure | 3.1–3.9 N |
| EXAMPLE 3 | Resin chips off after soaking overnight. Cohesive failure. | 6.6–8.2 N |
| EXAMPLE 4 | No peeling after 3 days soak test. | 3.3–6.3 N |

TABLE 2

T-Peel Test Results

| | Uncured Peel Test N/inch | Cured Peel Test N/inch |
|---|---|---|
| COMPARATIVE EXAMPLE 2 | Adhesion is too poor to test | 73.98 Resin/Poly Failure |
| EXAMPLE 5 | 1.78 Resin/Primer Peel | 194.0 Resin/Primer Failure |

As demonstrated by the results seen in Tables 1 and 2, the addition of a layered silicate to the primer formulation yields a primer that demonstrates significantly less peeling than primer compositions of the prior art.

The plates in Comparative Example 2 and Example 5 were subjected to a different peel test, a T-Peel test, to test uncured and cured adhesion according to the following method:

Sample preparation:

1) A 5-mil polyester sheet coated with a pressure sensitive adhesive was laminated to the top surface of an 11×7-inch piece of the uncured plate of the examples.

2) 1.5×7 inch strips were cut for testing uncured adhesion.

3) The remainder of the plate was completely cured with UV light and cut into 0.5×7 inch strips for testing cured adhesion.

The peel strength was measured on an Instron® 5500 tensile tester with 1 kN load cell using 150 mm per minute peel rate.

The plates in Comparative Example 1, Example 3, and Example 4 were also subjected to a scratch test.

The plates were made, wrapped in barrier plastic and stored before processing. The uncured resin was removed from the substrate with a high-pressure spray of soft water mixed with surfactant. The substrate was dried with hot air. The primer surface was covered with a thin polyester sheet immediately after drying, to protect the surface until the test was performed.

A scratch-type adherence tester (Stylometer, available from Quad Group, Inc.) draws a hemispherical diamond across a coating, at a constant rate of travel. Concurrently, an increasing normal force is imposed on the diamond until coating or substrate failure occurs. This failure force is a relative measure of adherence for coatings of similar type. This test is used to test all types of thin films.

The objective of the scratch test is to identify the earliest point at which coating failure occurs. This is done by microscopic examination of the diamond track after

What is claimed is:

1. A method of adhering a photopolymer resin to an underlying substrate during a process of manufacturing flexographic printing elements, the method comprising the steps of:
   a) coating an aqueous primer dispersion onto the substrate, wherein the aqueous primer comprises:
      i) a binder;
      ii) a copolymer or monomer;
      iii) a layered silicate;
      iv) optionally, a surfactant; and
      v) optionally, a dye or pigment; and
   b) adhering a photopolymer resin to the primed substrate, whereby a flexographic printing element is produced.

2. The method according to claim 1, wherein prior to step a), the substrate is pretreated with an adhesion promoting composition.

3. The method according to claim 1, wherein the binder comprises a polyurethane.

4. The method to claim 3, wherein the concentration of the polyurethane in the aqueous primer composition is about 20% to about 75% by weight based on dry content.

5. The method according to claim 1, wherein the copolymer is an ethylene acrylic acid copolymer.

6. The method according to claim 4, wherein the concentration of the copolymer in the aqueous primer composition is about 5% to about 40% by weight based on dry content.

7. The method according to claim 1, wherein the layered silicate is selected from the group consisting of phyllosilicates, micaceous minerals, mixed layered illite/smectite minerals, and combinations of the foregoing.

8. The method according to claim 7, wherein the layered silicate is a phyllosilicate and is selected from the group consisting of montmorillonite, nontronite, biedellite, volkonskonite, hectorite, saponite, sauconite, sobockite, stevensite, svinfordite, vermiculite, and combinations of the foregoing.

9. The method according to claim 8, wherein the layered silicate is a montmorillonite and is selected from the group consisting of sodium montmorillonite, calcium montmorillonite, magnesium montmorillonite, and combinations of the foregoing.

10. The method according to claim 7, wherein the concentration of the layered silicate in the aqueous primer composition is about 1% to about 10% by weight based on dry content.

11. The method according to claim 1, wherein the layered silicate is dispersed in water and the dispersion is then added to the aqueous primer composition.

12. The method according to claim 11, wherein the layered silicate dispersion is mixed into the aqueous primer composition through high shear mixing.

13. The method according to claim 1, wherein the surfactant is a non-ionic surfactant.

14. The method according to claim 11, wherein the concentration of the surfactant in the aqueous primer composition is about 0.5% to about 5% by weight based on dry content.

15. The method according to claim 14, wherein the surfactant is pre-mixed with a rheology modifier and water before being added to the aqueous primer composition.

16. The method according to claim 1, wherein the substrate is formed from a transparent or opaque material, wherein said material is selected from the group consisting of paper, cellulosic films, polymers and metals.

17. The method according to claim 11, wherein the aqueous primer dispersion is coated onto the substrate by roll coating, brush coating, or spray coating.

18. A flexographic printing element comprising:
   a) a flexible support layer;
   b) an aqueous primer dispersion coated onto the flexible support layer, the aqueous dispersion comprising:
      i) a binder;
      ii) a copolymer or monomer;
      iii) a layered silicate;
      iv) optionally, a surfactant; and
      v) optionally a dye or pigment; and
   c) a photosensitive layer on the aqueous primer dispersion coating.

* * * * *